(12) United States Patent
Moretti et al.

(10) Patent No.: US 7,920,988 B2
(45) Date of Patent: Apr. 5, 2011

(54) CAPTURING SYSTEM INTERACTIONS

(75) Inventors: Anthony D. Moretti, Peoria, IL (US); Cole D. Hagen, Peoria, IL (US); David A. Guldan, Washington, IL (US)

(73) Assignee: Caterpillar Inc., Peoria, IL (US)

( * ) Notice: Subject to any disclaimer, the term of this patent is extended or adjusted under 35 U.S.C. 154(b) by 159 days.

(21) Appl. No.: 12/270,823

(22) Filed: Nov. 13, 2008

(65) Prior Publication Data

US 2010/0121598 A1    May 13, 2010

(51) Int. Cl.
*G06F 11/00* (2006.01)
(52) U.S. Cl. ............... 702/188; 702/184; 714/38
(58) Field of Classification Search ............. 702/188, 702/90, 127, 184; 714/38
See application file for complete search history.

(56) References Cited

U.S. PATENT DOCUMENTS

| | | | |
|---|---|---|---|
| 4,766,595 A | 8/1988 | Gollomp | |
| 5,528,510 A | 6/1996 | Kraft | |
| 5,922,079 A | 7/1999 | Booth et al. | |
| 6,834,256 B2 | 12/2004 | House et al. | |
| 6,909,994 B2 | 6/2005 | Johnson et al. | |
| 7,006,878 B2 | 2/2006 | Schweizerhof et al. | |
| 7,177,773 B2 | 2/2007 | Lonn et al. | |
| 7,219,068 B2 | 5/2007 | Zelek et al. | |
| 7,249,284 B2 | 7/2007 | Shah et al. | |
| 7,254,514 B2 | 8/2007 | House et al. | |
| 7,263,510 B2 | 8/2007 | Chandler et al. | |
| 2003/0033093 A1* | 2/2003 | Nelson | 702/34 |
| 2003/0171897 A1 | 9/2003 | Bieda et al. | |
| 2004/0010733 A1 | 1/2004 | S. et al. | |
| 2004/0073404 A1* | 4/2004 | Brooks et al. | 702/183 |
| 2004/0128108 A1* | 7/2004 | Cutuli et al. | 702/185 |
| 2005/0138477 A1* | 6/2005 | Liddy et al. | 714/38 |
| 2005/0154561 A1 | 7/2005 | Legault et al. | |
| 2005/0222813 A1* | 10/2005 | Bjornson | 702/183 |
| 2005/0223263 A1 | 10/2005 | Flores et al. | |
| 2007/0016840 A1 | 1/2007 | Zurawka et al. | |
| 2007/0100584 A1* | 5/2007 | August et al. | 702/184 |
| 2009/0037836 A1* | 2/2009 | Moretti et al. | 715/771 |
| 2009/0265137 A1* | 10/2009 | Iida et al. | 702/183 |

* cited by examiner

*Primary Examiner* — John H Le
(74) *Attorney, Agent, or Firm* — Miller, Matthias & Hull

(57) ABSTRACT

A computer-implemented method for capturing interactions in a system is disclosed. The method includes receiving a selection of a first component of the system and receiving a selection of a second component of the system. The method further includes receiving a selection of an interaction between the first component and the second component, and displaying a list of functions performed by the selected interaction.

11 Claims, 9 Drawing Sheets

| | A | B | C | D | E |
|---|---|---|---|---|---|
| 1 | FUNCTIONS | TYPE | FUNCTION PHRASE | DESCRIPTION | FAILURE MODE |
| 2 | JOINT | PHYSICAL | | | |
| 3 | PERMANENT JOINT | PHYSICAL | | | |
| 4 | SENSE | INFORMATION | SENSES INFORMATION FROM | ANY TYPE OF SENSOR | ELECTRICAL |
| 5 | SUPPLY ELECTRICAL POWER | INFORMATION | SUPPLIES ENERGY TO | ELECTRICAL POWER TO RUN A DEVICE (NOT A SIGNAL) | ELECTRICAL |
| 6 | TRANSMIT SIGNAL | INFORMATION | TRANSMITS SIGNAL TO | A CONTROL SIGNAL THAT IS SENDING INFORMATION | ELECTRICAL |
| 7 | TRANSFER AIR | FLUID | TRANSFER AIR TO | TRANSFER AIR (OR MOSTLY AIR) FROM ONE COMPONENT TO ANOTHER | FLUID |
| 8 | TRANSFER CHARGE AIR | FLUID | TRANSFERS CHARGE AIR TO | TRANSFER INLET AIR (INCLUDES BEFORE AND AFTER TURBOCHARGING /SUPERCHARGING IF APPLICABLE) | FLUID |
| 9 | TRANSFER COOLANT | FLUID | TRANSFERS COOLANT TO | TRANSFERS COOLANT FROM ONE COMPONENT TO THE NEXT | FLUID |
| 10 | TRANSFER EXHAUST GAS | FLUID | TRANSFERS EXHAUST GAS TO | TRANSFERS EXHAUST GAS FROM ONE COMPONENT TO THE NEXT | FLUID |
| 11 | TRANSFER FLUID | FLUID | TRANSFERS FLUID TO | TRANSFERS FLUID FROM ONE COMPONENT TO THE NEXT | FLUID |
| 12 | TRANSFER FUEL | FLUID | TRANSFERS FUEL TO | TRANSFERS FUEL FROM ONE COMPONENT TO THE NEXT | FLUID |
| 13 | TRANSFER OIL | FLUID | TRANSFERS OIL TO | TRANSFERS OIL FROM ONE COMPONENT TO THE NEXT | FLUID |
| 14 | TRANSFER HYDRAULIC FLUID | FLUID | | | FLUID |
| 15 | CLEARANCE | PHYSICAL | HAS CLEARANCE WITH | COMPONENTS IN PROXIMITY TO EACH OTHER, EITHER MOVING OR STATIONARY. CLEARANCE IS NEEDED. | PHYSICAL |
| 16 | BEARING JOINT | PHYSICAL | HAS BEARING CONNECTION WITH | ANY TYPE OF BEARING | PHYSICAL |
| 17 | BOLTED JOINT | PHYSICAL | BOLTED TO | TWO OR MORE COMPONENTS HELD TOGETHER BY THREADED FASTENERS | PHYSICAL |
| 18 | CLAMP | PHYSICAL | CLAMPED TO | TWO OR MORE COMPONENTS HELD TOGETHER BY A CLAMP - BAND CLAMP, HOSE CLAMP | PHYSICAL |
| 19 | PRESS FIT | PHYSICAL | PRESS FITTED WITH | INTERFERENCE FIT BETWEEN TWO COMPONENTS FOR THE PURPOSE OF ATTACHING, LOCATING, OR TRANSMITTING FORCE | PHYSICAL |
| 20 | SEAL | PHYSICAL | HAS SEALED CONNECTION TO | TWO COMPONENTS MUST CONNECT OR CONTACT TO FORM A SEAL | PHYSICAL |
| 21 | SLIP FIT | | HAS SLIP FIT WITH | SLIP FIT BETWEEN TWO COMPONENTS FOR THE PURPOSE OF LOCATING | PHYSICAL |
| 22 | THREADED | PHYSICAL | THREADED CONNECTION WITH | ATTACHMENT BY MEANS OF A THREADED CONNECTION, INCLUDING HOSE CONNECTIONS AND PORT COMPONENTS | PHYSICAL |

*FIG. 3*

| | FMEA | | | |
|---|---|---|---|---|
| | COMPONENT 502 | FUNCTION 504 | FAILURE MODE 506 | CAUSE OF FAILURE 508 |
| 1 | EXHAUST MANIFOLD | BOLTED TO TURBOCHARGER | BROKEN CONNECTION | MECHANICAL FATIGUE |
| 2 | | | | THERMAL FATIGUE |
| 3 | | | | SHOCK LOAD |
| 4 | | HAS SEALED CONNECTION TO TURBOCHARGER | LOOSE CONNECTION | THERMAL FATIGUE |
| 5 | | | | VIBRATION |

| EDIT COMPONENTS | | | |
|---|---|---|---|
| | A | B | C |
| 1 | CLOSE UPDATE | | |
| 2 | COMPONENT | SUBSYSTEM | DESCRIPTION |
| 3 | CGI VALVE | CGI SYSTEM | CGI FLOW CONTROL VALVE |
| 4 | EXHAUST BP VALVE | CGI SYSTEM | EXHAUST RELEASE VALVE |
| 5 | CGI FLOW METER (VENTURI) | CGI SYSTEM | CGI FLOW MEASUREMENT DEVICE |
| 6 | LINES GROUPS | CGI SYSTEM | CLEAR AIR INDUCTION LINES |
| 7 | ... | ... | ... |
| 8 | ... | ... | ... |
| 9 | ... | ... | ... |

FIG. 8

| EDIT INTERACTION FUNCTION LIBRARY | | | | |
|---|---|---|---|---|
| CLOSE | UPDATE | | | |
| | 912 | 902 | 904 | 906 | 908 | 910 |
| | A | B | C | D | E |
| | FUNCTIONS | TYPE | FUNCTION PHRASE | DESCRIPTION | FAILURE TYPE |
| 1 | | | | | |
| 2 | SENSE | INFORM | SENSES INFORMATION FROM | ANY TYPE OF SENSOR | ELECTRICA |
| 3 | SUPPLY ELECTRICAL POWER | INFORM | SUPPLIES ENERGY TO | ELECTRICAL POWER TO RUN A DEVICE (NOT A SIGNAL) | ELECTRICA |
| 4 | TRANSMIT SIGNAL | INFORM | TRANSMITS SIGNAL TO | A CONTROL SIGNAL THAT IS SENDING INFORMATION | ELECTRICA |
| 5 | TRANSFER AIR | FLUID | TRANSFER AIR TO | TRANSFER AIR (OR MOSTLY AIR) FROM ONE COMPONENT TO ANOTHER | FLUID |
| 6 | TRANSFER CHARGE AIR | FLUID | TRANSFERS CHARGE AIR TO | TRANSFER INLET AIR (INCLUDES BEFORE AND AFTER TURBOCHARGING /SUPERCHARGING IF APPLICABLE) | FLUID |
| 7 | TRANSFER COOLANT | FLUID | TRANSFERS COOLANT TO | TRANSFERS COOLANT FROM ONE COMPONENT TO THE NEXT | FLUID |
| 8 | TRANSFER EXHAUST GAS | FLUID | TRANSFERS EXHAUST GAS TO | TRANSFERS EXHAUST GAS FROM ONE COMPONENT TO THE NEXT | FLUID |
| 9 | TRANSFER FLUID | FLUID | TRANSFERS FLUID TO | TRANSFERS FLUID FROM ONE COMPONENT TO THE NEXT | FLUID |
| 10 | TRANSFER FUEL | FLUID | TRANSFERS FUEL TO | TRANSFERS FUEL FROM ONE COMPONENT TO THE NEXT | FLUID |
| 11 | TRANSFER OIL | FLUID | TRANSFERS OIL TO | TRANSFERS OIL FROM ONE COMPONENT TO THE NEXT | FLUID |
| 12 | TRANSFER HYDRAULIC FLUID | FLUID | | | FLUID |
| 13 | CLEARANCE | PHYSICAL | HAS CLEARANCE WITH | COMPONENTS IN PROXIMITY TO EACH OTHER, EITHER MOVING OR STATIONARY. CLEARANCE IS NEEDED. | PHYSICAL |
| 14 | BEARING JOINT | PHYSICAL | HAS BEARING CONNECTION WITH | ANY TYPE OF BEARING | PHYSICAL |
| 15 | BOLTED JOINT | PHYSICAL | BOLTED TO | TWO OR MORE COMPONENTS HELD TOGETHER BY THREADED FASTENERS | PHYSICAL |
| 16 | CLAMP | PHYSICAL | CLAMPED TO | TWO OR MORE COMPONENTS HELD TOGETHER BY A CLAMP - BAND CLAMP, HOSE CLAMP | PHYSICAL |
| 17 | PRESS FIT | PHYSICAL | PRESS FITTED WITH | INTERFERENCE FIT BETWEEN TWO COMPONENTS FOR THE PURPOSE OF ATTACHING, LOCATING, OR TRANSMITTING FORCE | PHYSICAL |
| 18 | SEAL | PHYSICAL | HAS SEALED CONNECTION TO | TWO COMPONENTS MUST CONNECT OR CONTACT TO FORM A SEAL | PHYSICAL |
| 19 | SLIP FIT | | HAS SLIP FIT WITH | SLIP FIT BETWEEN TWO COMPONENTS FOR THE PURPOSE OF LOCATING | PHYSICAL |
| 20 | THREADED | JOINT | THREADED CONNECTION WITH | ATTACHMENT BY MEANS OF A THREADED CONNECTION, INCLUDING HOSE CONNECTIONS AND PORT COMPONENTS | PHYSICAL |

FIG. 9

CAPTURING SYSTEM INTERACTIONS

TECHNICAL FIELD

The present disclosure is directed to system interactions and, more particularly, to systems and methods for capturing system interactions.

BACKGROUND

Companies in product development industries, such as the automotive industry, the construction equipment industry, the consumer electronics industry, the defense systems industry, and the software industry produce complex systems. These systems usually have many components that each perform a simple task in the overall operation of the system. For example, a vehicle or machine may have a transmission system, an exhaust system, a suspension system, a steering system, and other components that cooperate in the functioning of the vehicle or machine. While each of these components may perform its own task, they may, in some way, interact with or affect the operation of the other components.

It is useful to keep track of these interactions in some situations. For example, in some industries, each component might be designed by a different team. To ensure the design process goes smoothly, however, one design team should be able to determine when a design change to its component may have some impact on a component designed by another team due to a particular interaction between the two components. Keeping track of these interactions allows the design teams, though separate, to design the system in concert. In addition, keeping track of these interactions enables failure mode and effects analyses (FMEA) to be carried out.

Some tools have been developed to keep track of interactions in a system. One is described in U.S. Patent Application Publication No. 2005/0138477 by Liddy et al., published on Jun. 23, 2005 (the '477 publication). The '477 publication describes a system for FMEA. The system creates an interface matrix diagram based on a boundary diagram listing component interactions input by a user. The user adds to the interface matrix diagram by inputting numerical strengths of the interactions. The system then creates a parameter diagram based on the interface matrix diagram, to which the user enters textual descriptions of noise factors, inputs, control factors, and outputs to indicate influences of potential failures for the system. The system then generates a FMEA form based on the parameter diagram.

While the system of the '447 publication allows the user to capture some details of interactions between system components, it may be inadequate. For example, no descriptions or functions of the interactions can be captured. Further, there is no way to ensure the information entered by the user follows any particular convention. Therefore, the convention used to create the boundary diagram, the interface matrix, and the parameter diagram may vary across systems and users. Accordingly, FMEA forms generated by the system may be inconsistent and confusing.

The present disclosure is directed to overcoming one or more of the problems set forth above.

SUMMARY OF THE INVENTION

One aspect is directed to a computer-implemented method for capturing interactions in a system. The method may include receiving a selection of a first component of the system, and receiving a selection of a second component of the system. The method may further include receiving a selection of an interaction between the first component and the second component, and displaying a list of functions performed by the selected interaction.

Another aspect is directed to a computer-readable storage medium storing a computer program which, when executed by a computer, causes the computer to perform a method for capturing interactions in a system. The method may include receiving a selection of a first component of the system, and receiving a selection of a second component of the system. The method may further include receiving a selection of an interaction between the first component and the second component, and displaying a list of functions performed by the selected interaction.

Yet another aspect is directed to an apparatus. The apparatus may include an input device for receiving user input, a display device, and a component database containing information about components of a system. The apparatus may further include an interaction function library containing information about functions performed by interactions between the components of the system, and a processor in communication with the input device, the display device, the component database, and the interaction function library. The processor may receive, via the input device, a selection by the user of a first component of the components of the system; receive, via the input device, a selection by the user of a second component of the components of the system; and receive, via the input device, a selection by the user of an interaction between the first component and the second component. The processor may further identify functions performed by the selected interaction contained in the interaction function library; and display, via the display device, a list of the identified functions.

BRIEF DESCRIPTION OF THE DRAWINGS

FIG. 3 shows a representation of exemplary disclosed interaction function information maintained by the system interaction capturing environment of FIG. 1;

FIG. 5 shows an exemplary disclosed FMEA document generated by the system interaction capturing environment of FIG. 1;

FIG. 8 shows an exemplary disclosed edit components window associated with the interaction editor of FIG. 6; and FIG. 9 shows an exemplary disclosed edit interaction library window associated with the interaction editor of FIG. 6.

DETAILED DESCRIPTION

Figure 1:
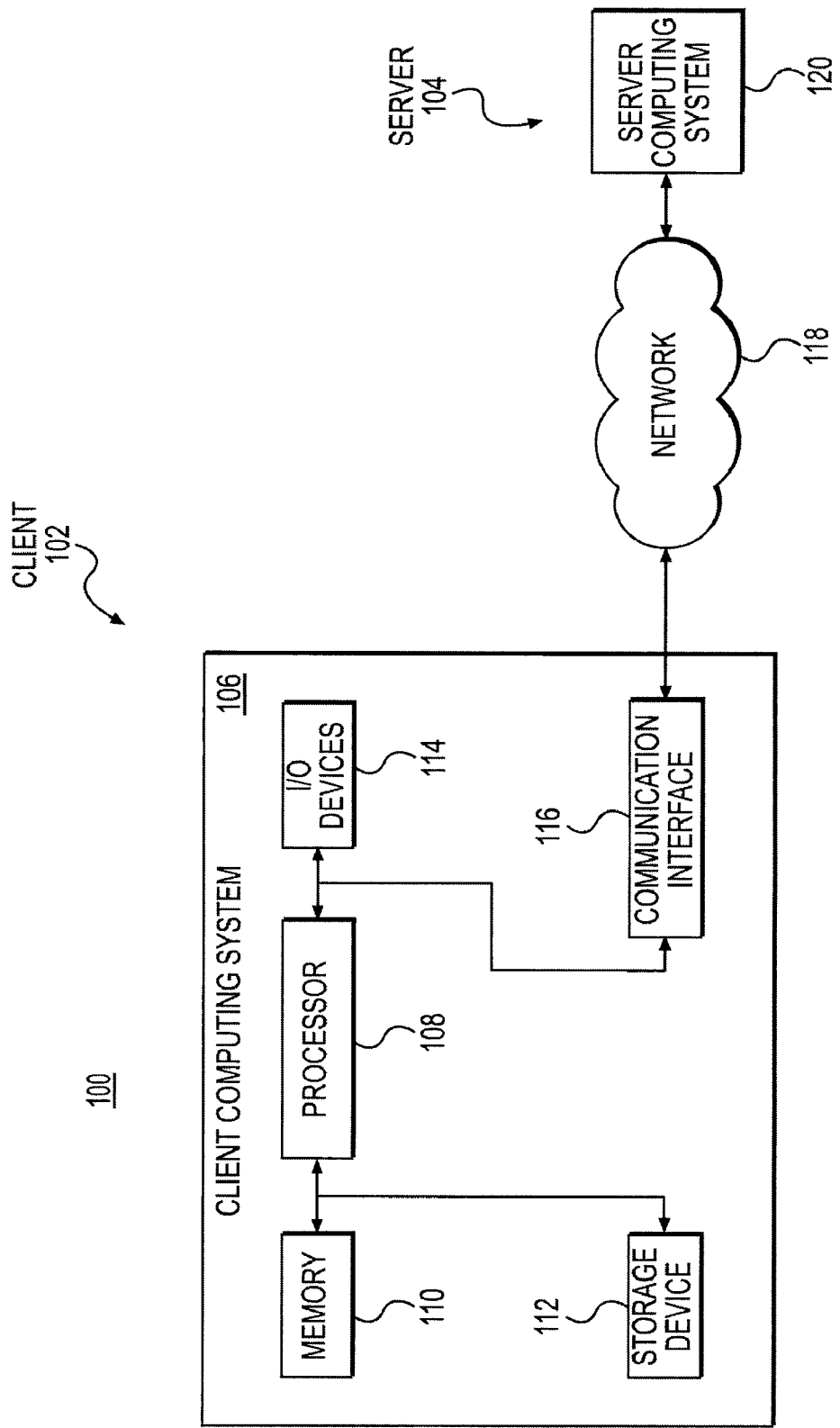
FIG. 1 shows a representation of an exemplary disclosed system interaction capturing environment.

FIG. 1 shows a block diagram illustrating an exemplary disclosed system interaction capturing environment 100. Environment 100 may represent any type of environment associated with monitoring, managing, or producing systems. For example, environment 100 may include a manufacturer or a designer of one or more product systems, such as vehicles, electronic devices, excavating machines, power generating equipment, software, or other systems that include multiple interacting subsystems or components. As used herein, "system" may refer to any product, device, apparatus, machine, or organization made up of individual components, each performing a task in the overall operation of the system. For example, a vehicle or machine may be made up of an engine system, an exhaust system, an electrical system, a hydraulic system, a suspension system, or other components that cooperate to affect operation of the vehicle or machine.

Environment 100 may include a client 102 and a server 104. Client 102 may represent, for example, an employee, a designer, a manager, a customer, an agent, a contractor, or another entity associated with monitoring, managing, designing, or producing product systems. A client computing system 106 may receive input from, and provide output to, a user in connection with such tasks. Client computing system 106 may be a platform including any type of processor-based system on which disclosed processes and methods may be implemented. For example, client computing system 106 may be a workstation such as a desktop or laptop computer, a personal digital assistant (PDA), a cellular telephone, or another computing system known in the art.

As shown in FIG. 1, client computing system 106 may include hardware components, such as a processor 108 in communication with a memory 110, a storage device 112, input/output devices 114, and a communication interface 116 for communicating with a server computing system 120 via a network 118 (e.g., the Internet, an intranet, or another packet-switched network). Client computing system 106 may include additional, fewer, and/or different components than those listed above, as the components listed above are exemplary only and not intended to be limiting.

Processor 108 may include one or more devices configured to execute instructions and to process data to perform the functions of client computing system 106. For example, processor 108 may include one or more general- or special-purpose microprocessors (e.g., a CPU) configured to execute computer program instructions to perform disclosed processes, which will be discussed in detail below.

Memory 110 may include one or more devices for storing information associated with operations of client computing system 106. For example, memory 110 may include random access memory (RAM), such as static RAM (SRAM), dynamic RAM (DRAM), and/or other volatile memory; and/or nonvolatile memory such as flash memory. Memory 110 may also include read-only memory (ROM), such as erasable programmable read-only memory (EPROM), electrically erasable programmable read-only memory (EEPROM), a SIM card, or other suitable read-only memory. Computer program instructions for performing the disclosed processes may be loaded from ROM and into RAM for execution by processor 108.

Storage device 112 may include any type of mass storage device for storing information that processor 108 may require to perform the disclosed processes. For example, storage device 112 may include one or more magnetic and/or optical disk devices, such as a hard drive; a CD-ROM drive; a DVD-ROM drive; a magnetic tape drive; a Flash drive; or any other suitable mass-media storage device.

Figure 2:
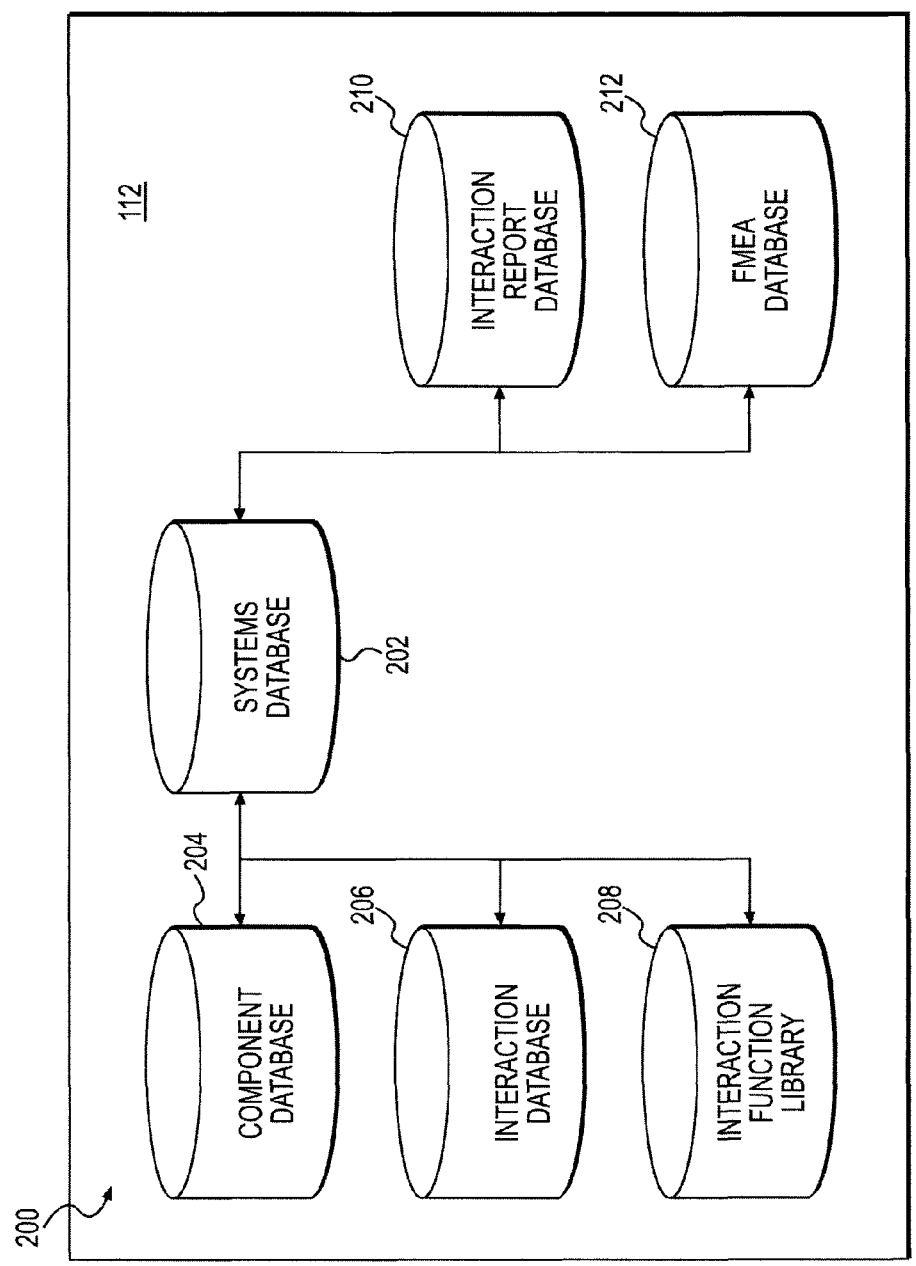
FIG. 2 shows a representation of exemplary disclosed system information used by the system interaction capturing environment of FIG. 1.

Storage device 112 may store system information 200 relating to systems monitored, managed, designed, or otherwise associated with environment 100. As shown in FIG. 2, system information 200 may include a systems database 202, a component database 204, an interaction database 206, an interaction function library 208, an interaction report database 210, and a failure mode and effects analysis (FMEA) database 212.

Systems database 202 may contain information relating to one or more systems associated with environment 100. Specifically, systems database 202 may link information contained in component database 204, in interaction database 206, in interaction function library 208, or in interaction report database 210 to thereby define characteristics of the systems associated with environment 100 (e.g., files for the systems). For example, in the case of a company that designs and manufactures vehicles or machines, systems database 202 may contain information about different vehicles or machines designed and manufactured by the company. This information may associate components listed in component database 204 that make up the vehicles or machines; types of interactions, listed in interaction database 206, between these components; specific functions performed or achieved by these interactions listed in interaction function library 208; descriptions of these interactions listed in interaction function library 208; and interaction reports, contained in interaction report database 210, for the vehicles or machines. Processor 108 may utilize the information stored in systems database 202 to access appropriate information in component database 204, in interaction database 206, in interaction function library 208, or in interaction report database 210 in connection with processes described below.

Component database 204 may contain information about components (e.g., subsystems) that make up the systems associated with environment 100. Continuing with the vehicle or machine designer and manufacturer example above, component database 204 may list different components used in the vehicles or machines designed and manufactured by the company. For example, component database 204 may list different engine system components, exhaust system components, hydraulic system components, cooling system components, air compressor system components, electronic system components, suspension system components, and/or other components used in the vehicles or machines. In addition, component database 204 may contain model numbers, serial numbers, manufacturing information, subsystems in which the components belong (i.e., parentage information), or other information useful for identifying or classifying the components. The information in component database 204 may be stored or listed in a spreadsheet format, for example, so that it may be easily searched and accessed by processor 108.

Interaction database 206 may contain information about different types of interactions that can occur between the components during operation of the systems. Typically, the nature of systems (e.g., vehicles or machines) is such that the number of different types of interactions that can occur is limited. Engineers and designers have found that most interactions can be classified into one of four different categories: a fluid interaction, an information interaction, a physical interaction, or an energy interaction. It is to be appreciated, however, that other categories of interactions are possible depending upon the nature of the system at issue.

In a fluid interaction, a fluid may flow from one component to another component. For example, in a vehicle or a machine, coolant may be directed through the cooling system to cool one or more other components of the vehicle or machine. In another example, hydraulic fluid may be pumped from a hydraulic system to move an implement (e.g., a bucket) on an excavating machine. In an information interaction, information, such as an electrical signal containing data, may be transmitted from one component to another. For example, in a vehicle or a machine, the engine control module may send to the fuel system an electrical signal containing a command to increase fuel input to the engine. In a physical interaction, one component may be in physical contact with another component. For example, in a vehicle or a machine, the suspension system may be mounted to the frame. In an energy interaction, energy may be transferred from one component to another. For example, heat energy from the engine system may be transferred to the heating system to heat the cabin.

Additionally, interaction database 206 may contain information relating to possible "directions" of the interactions discussed above. An interaction may be positive, negative, or bidirectional. For example, a positive fluid interaction between component A and component B may indicate that fluid flows in the direction from component A to component B. Conversely, a negative fluid interaction may indicate that fluid flows in the direction from component B to component A. A bidirectional fluid interaction may indicate that fluid flows in the direction from component A to component B and in the direction from component B to component A. Further, an interaction may be desirable or undesirable. A desirable interaction may indicate that the interaction is beneficial to the system and/or is intended. An undesirable interaction may indicate that the interaction occurs when it should not and/or is unintended. For example, a flow of fuel from the tank to the engine may be a desirable fluid interaction, while a fuel leak (i.e., a flow of fuel from the tank to the atmosphere) may be an undesirable fluid interaction. In another example, the engine being mounted to a frame may be a desirable physical interaction, while engine wear caused by the mounting hardware contacting the engine may be an undesirable physical interaction.

Interaction function library 208 may store information about the functions performed or accomplished by the different types of interactions discussed above. In a system, such as a vehicle or a machine, the interaction categories discussed above (fluid, information, physical, and energy) may perform or accomplish only a limited number of discrete functions. That is, due to the nature of the particular system, there may be a discrete number of functions that can be performed or achieved by the different interactions.

For example, in a vehicle or a machine, the number of different functions performed or accomplished by fluid interactions may be finite. Such functions may include, for example, transferring air from one component to another, transferring fuel from one component to another, transferring hydraulic fluid from one component to another, transferring charge air (i.e., compressed air) from one component to another, transferring coolant from one component to another, transferring oil from one component to another, or transferring water from one component to another. Similarly, the functions associated with information interactions may also be limited in number. Examples include transmitting a command signal from one component to another, transmitting an information signal from one component to another, transmitting an acknowledgement signal from one component to another, or transmitting an error signal from one component to another. Exemplary functions associated with physical interactions include clamping one component to another, welding one component to another, bolting one component to another, soldering one component to another, slip-fitting one component to another, and frictionally coupling one component to another (e.g., a belt). Finally, exemplary functions associated with energy interactions may include transferring electrical power from one component to another, transferring heat from one component to another, or transferring torque from one component to another.

Toward this end, interaction function library 208 may contain a list (i.e., a library) of functions for each of the four categories of interactions discussed above (fluid, information, physical, and energy). In this manner, system interactions may be captured in a consistent manner, according to a convention, as discussed below. A user of client computing system 106, such as an engineer, a designer, or a system administrator, may update interaction function library 208 as necessary to edit existing functions, to add new functions, or to remove existing functions. For example, an engineer may update interaction function library 208 if an existing vehicle or machine design is modified such that the vehicle or machine exhibits an interaction function not yet available in interaction function library 208. Similarly, the interaction function library 208 may be updated if a new vehicle or machine is designed that exhibits an interaction function not yet contained in interaction function library 208. It is noted that the interaction functions listed above are exemplary only, and are not intended to be limiting or exhaustive. Other interaction functions are possible depending on the nature of the particular system at issue.

Interaction function library 208 may include further information describing the interaction functions discussed above, such as a textual description providing further information about the particular interactions in a system. These textual descriptions may be entered by a user of client computing system 106, and may be stored in interaction function library 208. The description may include any information that the user deems useful in designing, troubleshooting, or otherwise understanding the functionality interactions.

FIG. 3 shows a representation of interaction function information 300 contained in interaction function library 208. Interaction function information 300 may include, for example, a table, a spreadsheet, a matrix, a relational database, or another suitable data storage structure. Interaction function information 300 may include a column 302 listing interaction functions; a column 304 listing types of interactions corresponding to the interaction functions; a column 306 listing phrases explaining how the particular interaction function operates between two components (i.e., how the first component interacts with the second component); a column 308 listing descriptions or other information about the interaction functions, such as textual comments entered by a user; and a column 310 listing failure modes associated with the interaction functions. This information may be used in the generation of interaction reports, discussed below.

Figure 4:
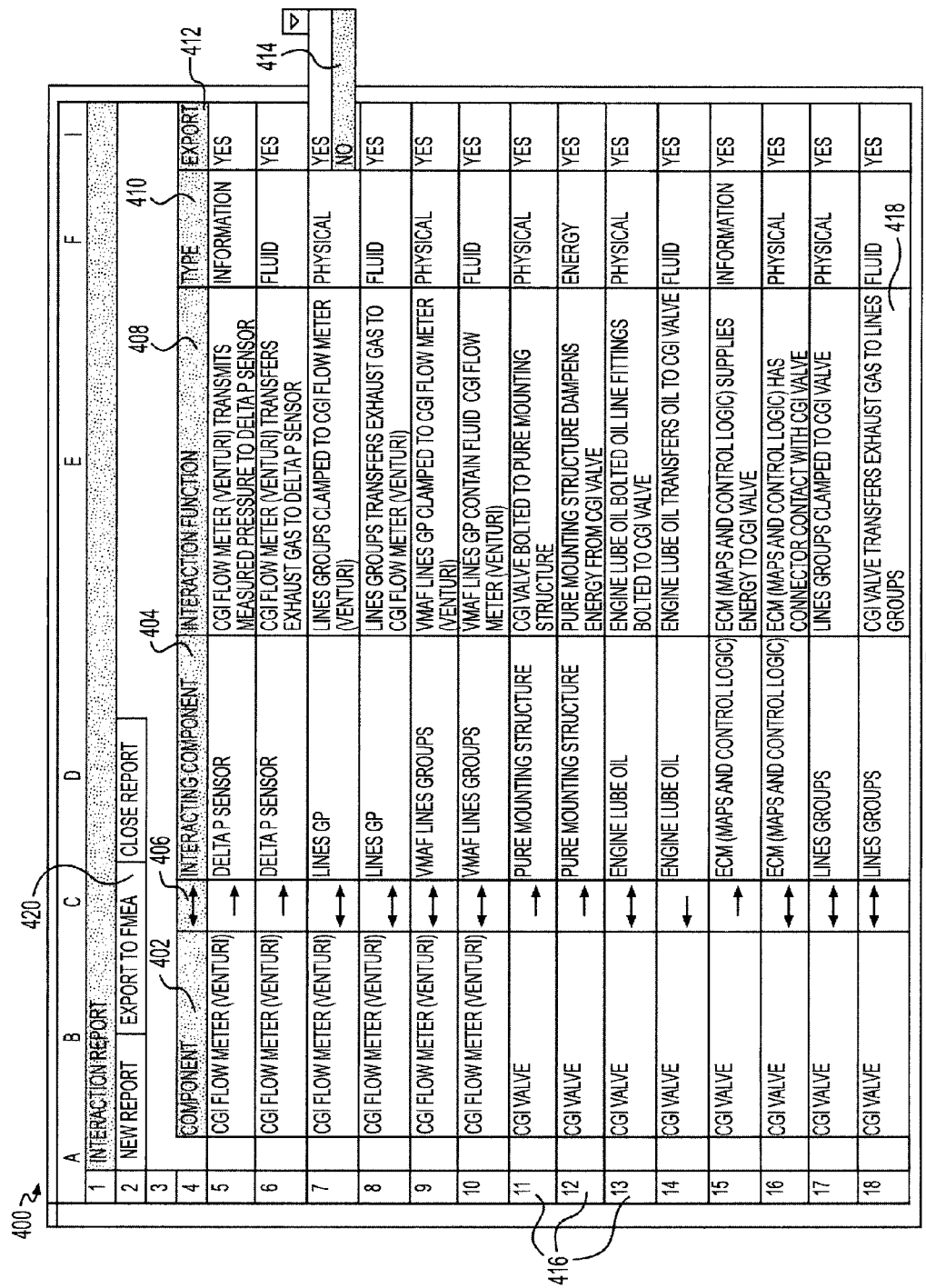
FIG. 4 shows an exemplary disclosed interaction report generated by the system interaction capturing environment of FIG. 1.

Interaction report database 210 may contain interaction reports for different systems associated with environment 100. An interaction report may be useful to an engineer or designer in the analysis of the interactions existing in a particular system. FIG. 4 shows an exemplary interaction report 400 that may be generated and displayed as a graphical user interface (GUI) by client computing system 106 for a particular system (e.g., a vehicle or a machine). Interaction report 400 may include a column 402 listing one or more components of the system; a column 404 listing one or more components of the system with which the components in column 402 interact; a column 406 listing the directions of the interactions between the components; a column 408 listing sentences describing how the interactions function (i.e., how the first component operates on the second component); a column 410 listing the types of the interactions; and a column 412 providing drop down menus 414 allowing a user to select which interactions to export to a failure mode and effects analysis (FMEA) document, discussed blow. It is noted that each of rows 416 in interaction report 400 may correspond to a single interaction in the system.

As shown by FIG. 4, column 408 may be a descriptive sentence 418 for each interaction (i.e., each row 416). Sentences 418 may be generated by client computing system 106 based on the particular components listed in columns 402 and 404. In particular, client computing system 106 may access interaction function information 300 contained in interaction function library 208 (FIG. 3). Client computing system 106 may look up the particular interacting components listed in columns 402 and 404 (in a given row 416), the type of interaction listed in column 410, and the particular function of the interaction in interaction function library 208. Then, client computing system 106 may retrieve the appropriate phrase from column 308 describing the interaction. Based on this information, sentences 418 may be generated.

In addition, interaction report 400 may include an export to FMEA button 420, the user's selection of which may cause client computing system 106 to generate and populate a FMEA document, discussed below. Drop-down menus 414 may allow the user to select which interactions (i.e., rows 416), in particular, to export to the FMEA document.

FMEA database 212 may contain FMEA documents for one or more of the systems associated with environment 100. A FMEA document is useful for analyzing potential failure modes of a system, during the design stage, to avoid or reduce the risk of future failures of the system in practice. Subsequently, a FMEA document may be used to continuously improve the system. A FMEA document may have other applications, such as in process control.

FIG. 5 shows an exemplary FMEA document 500 for a system associated with environment 100. FMEA document 500 may be, for example, an editable spreadsheet GUI allowing input from a user. FMEA document 500 may be generated by client computing system 106 and stored in FMEA database 212. FMEA document 500 may include a column 502 listing components of the system; a column 504 listing the interaction functions performed by the components (i.e., how the first component operates on the second component); a column 506 listing potential failure modes of the components; and a column 508 listing potential causes of these failure modes. It is noted that a failure mode of a system may refer to a particular manner in which a component of the system is known to fail. In the example shown in FIG. 5, the exhaust manifold has two interaction functions: bolted to the turbocharger; and a sealed connection with the turbocharger. FMEA document 500 also indicates that the particular failure mode of the first interaction function (bolted to the turbocharger) is a broken connection and, further, that three known causes of the broken connection are mechanical fatigue, thermal fatigue, and shock load. Likewise, FMEA document 500 indicates that the particular failure mode of the second interaction function (sealed connection with turbocharger) is a loose connection and, further, that two potential causes of the loose connection are thermal fatigue and vibration.

Client computing system 106 may generate FMEA document 500 upon a user's selection of export to FMEA button 420 (FIG. 4). Specifically, client computing system 106 may access interaction function information 300 contained in interaction function library 208 (FIG. 3). Client computing system 106 may look up in interaction function information 300 the components listed in column 502, and may retrieve all interaction functions, failure modes, and causes of failure modes associated with the component. Then, client computing system 106 may use this information to generate and to populate FMEA document 500. It is to be appreciated that FMEA document 500 may include additional columns containing further information useful in analyzing the failure modes of a system (not shown). The user may edit or supplement the information shown in FMEA document 500 by providing input to any of these columns.

Input/output devices 114 may include any device configured to receive input from a user of client computing system 106 and to provide corresponding input command signals to client computing system 106; and/or to receive command signals from client computing system 106 and to provide corresponding output to the user. For example, input/output devices 114 may include a console with an integrated keyboard and mouse to allow a user to input parameters associated with client computing system 106. Input/output devices 114 may also include a display (e.g., an LCD, a CRT display, a plasma display, a touch-screen) including a graphical user interface executed by client computing system 106 for inputting/outputting information. Input/output devices 114 may also include peripheral devices such as, for example, a printer for printing information associated with client computing system 106; a user-accessible disk drive (e.g., a USB port, a floppy, CD-ROM, or DVD-ROM drive, etc.) to allow the user to input data stored on a portable media device; a microphone; a speaker; and/or any other suitable type of interface device for inputting and/or outputting information to and/or from a computing system. The results of received data may be provided as output from client computing system 106 via input/output devices 114 for printed display, viewing, and/or further communication to other system devices.

Communication interface 116 may include any device configured to transmit and to receive data through network 118. Communication interface 116 may include network architecture, such as a telephone-based network (such as a PBX or POTS), a local area network (LAN), a wide area network (WAN), a dedicated intranet, and/or the Internet. Communication interface 116 may include any suitable combination of wired and/or wireless components and systems. For example, communication interface 116 may include a modulator, a demodulator, a multiplexer, a demultiplexer, a network card, an antenna, a modem, or another suitable communication device.

Server computing system 120 may have components similar to those discussed above in connection with client computing system 106. Accordingly, further discussion of the construction of server computing system 120 is omitted. Server 104 may represent, for example, an employer, a data service provider, a private network storage location, or another entity associated with environment 100. It is contemplated that server computing system 120 may store any or all of the information discussed above as being stored on client computing system 106 (e.g., some or all of system information 200). While the disclosed processes may be described herein as being performed entirely by client computing system 106 or by server computing system 120, it is contemplated that the disclosed processes may be performed by a combination thereof. Further, processes disclosed as being performed by client computing system 106 may alternatively be performed by server computing system 120, and vice versa.

Figure 6:
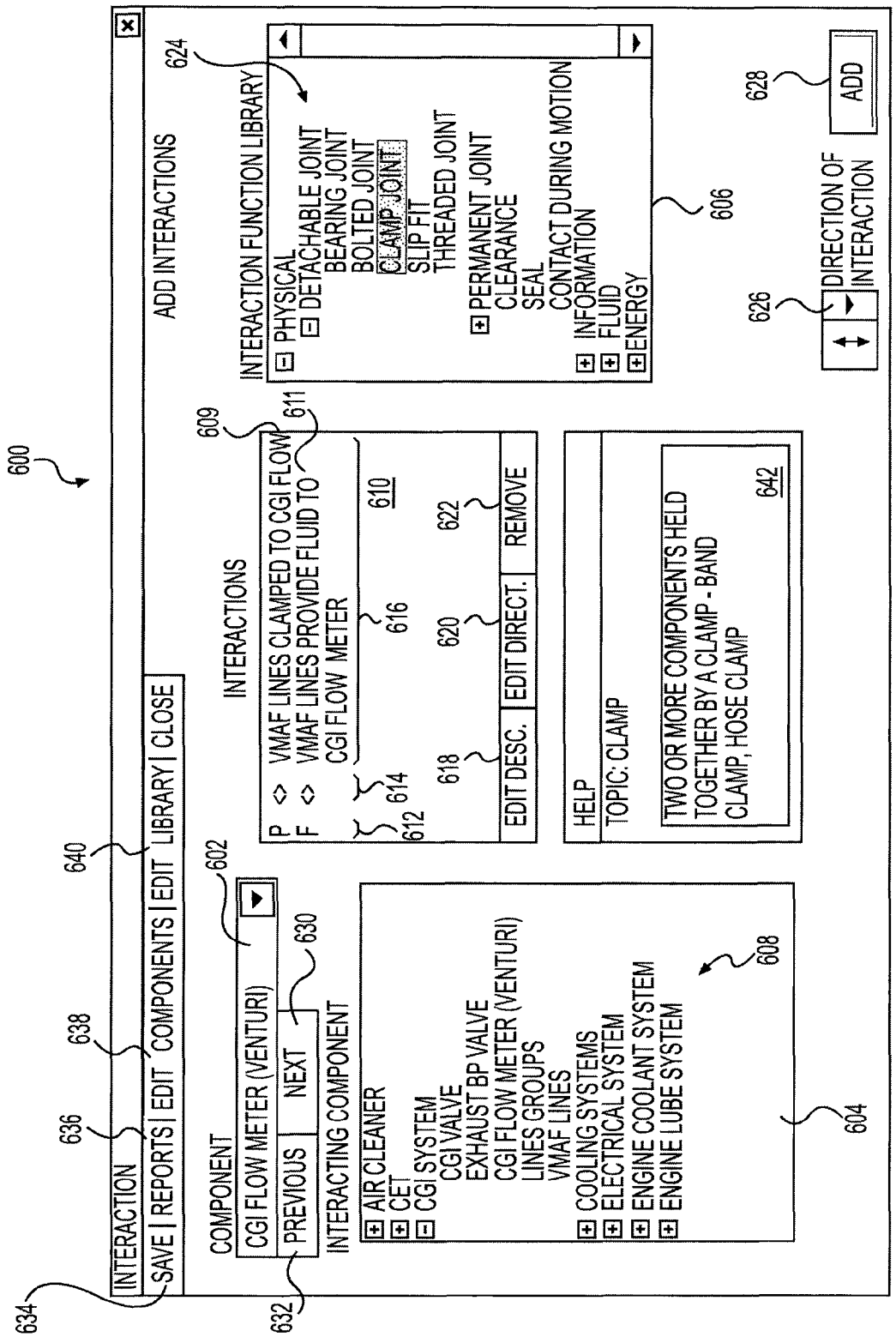
FIG. 6 shows an exemplary disclosed interaction editor provided by the system interaction capturing environment of FIG. 1.

FIG. 6 shows an exemplary interaction editor 600 provided to a user of client computing system 106. Interaction editor 600 may be graphical interface (GUI) allowing the user to capture and define the particular interactions for systems associated with environment 100. Interaction editor 600 may be executed and provided to a user by way of client computing system 106 and/or by way of server computing system 120. For example, interaction editor 600 may be displayed to the user via input/output devices 114. Likewise, the user may provide input to client computing system 106 via input/output devices 114 to manipulate interaction editor 600 and thereby capture and define the interactions. Interaction editor 600 may be a software tool, such as a Web interface; or a software application designed to run in a spreadsheet program, such as Microsoft Excel™.

Referring to FIG. 6, interaction editor 600 may include a component selection menu 602, an interacting component selection window 604, and an interaction function library window 606. Component selection menu 602 may be, for example, a drop-down menu allowing the user to select a desired component of a particular system of interest. Accessing component selection menu 602 may cause client computing system 106 to display a list of components contained in component database 204 (FIG. 2). Component selection menu 602 may list all components contained in component database 204. Alternatively, client computing system 106 may leverage systems database 202 (FIG. 2) to determine which components in component database 204 correspond to the particular system with which the user is concerned (e.g., a certain vehicle or machine), and may list only those components in component selection menu 602. In either case, the user may select a component from component selection menu 602 for which the user desires to capture or define interactions.

Interacting component selection window 604 may list all components 608 with which the components listed in component selection menu 602 may potentially interact. In the example shown in FIG. 6, components 608 are listed in expandable/collapsible outline. The user may "drill down" to the particular component of interest based on knowledge of the system, such as knowledge of the subsystem that contains the component. For example, the user may select and expand the CGI (Clean Gas Induction) system in order to access the CGI valve component. It is contemplated, however, that interacting component selection window 604 may have a different format, such as a drop-down menu similar to component selection menu 602. The user may choose a component from interacting component selection window 604 for which the user desires to capture or define interactions.

After selecting a first component from component selection menu 602, and selecting a second component from interacting component selection window 604, interaction editor 600 may allow the user to capture or define interactions between the first component and the second component. Interaction editor 600 may access systems database 202 (FIG. 2) to identify any known interactions between the selected components (e.g., previously captured and stored interactions). Interaction editor 600 may retrieve this information from interaction database 206 and from interaction function library 208 (FIG. 2). The known interactions may be displayed in an interactions window 610. In other words, interaction editor 600 may identify any existing interactions between the component selected from component selection menu 602 and the component selected from interacting component selection window 604, and may display information about the identified interactions in interactions window 610.

Interactions window 610 may display information about the known interactions, such as, for example, types 612 of the interactions (physical, fluid, information, or energy), directions 614 of the interactions, and sentences 616 describing the functions performed by the interactions between the components. In the example shown in FIG. 6, interactions window 610 lists a first interaction 609 and a second interaction 611. For first interaction 609, a "P" is displayed to indicate that the type of the interaction is physical; a double-sided arrow is displayed to indicate that the interaction is bidirectional; and the interaction function sentence "Exhaust Manifold Bolted to Turbocharger" is displayed. For second interaction 611, an "F" is displayed to indicate that the interaction type is fluid; a left-pointing arrow is displayed to indicate that the direction of the interaction is from the second component to the first component; and the interaction function sentence "Exhaust Manifold Transfers Fluid to Turbocharger" is displayed. It is contemplated that other information about the interactions may be shown in interactions window 610.

It is noted that interaction editor 600 may generate sentences 616 as discussed above in connection with interaction report 400 (FIG. 4). That is, interaction editor 600 may look up the interaction function in interaction function library 208 to retrieve a corresponding phrase describing the function performed. Specifically, interaction editor 600 may look up the function in column 302 of interaction function information 300 (FIG. 3), and may retrieve a corresponding phrase from column 306. Then, interaction editor 600 may generate a sentence 616 describing the function performed by the interaction based on the two components at issue (i.e., the component selected from component selection menu 602 and the component selected from interacting component selection window 604) and on the retrieved phrase.

Interactions window 610 may include an edit description button 618, an edit direction button 620, and a remove button 622. Selection of edit description button 618 may allow the user to enter a new description or to modify an existing description for a desired interaction listed in interactions window 610. Interaction editor 600 may store this new or modified description in interaction function library 208 (FIG. 2). Similarly, selection of edit direction button 620 may allow the user to enter or modify a direction of an interaction listed in interactions window 610. Interaction editor 600 may store the direction in interaction function library 208 (FIG. 2). Selection of remove button 622 may allow the user to remove a selected interaction from interactions window 610. Interaction editor 600 may delete the removed interaction from interaction function library 208. Alternatively or additionally, interaction editor 600 may access systems database 202 to dissociate the removed interaction from the particular system at issue.

Interaction function library window 606 may allow the user to add interactions between the component selected from component selection menu 602 and the component selected from interacting component selection window 604. Interaction editor 600 may access interaction function library 208 (FIG. 2) to retrieve all existing interaction functions; that is, all interaction functions currently contained in interaction function library 208. In the example shown in FIG. 6, interactions may be listed as an expandable/collapsible outline 624. A first level of the outline may correspond to the four types of interactions-physical, information, fluid, and energy. Selection of a type of interaction (in the first level) may allow the user to "drill down" to, and to select, a desired function performed by the interaction. It is contemplated, however, that other suitable configurations may be used.

When the user selects the "physical" interaction type in the first level, interaction editor 600 may expand outline 624 to a second level revealing possible functions performed by the physical interaction. In this example, possible functions performed by the physical interaction include "detachable joint," "permanent joint," "clearance," "seal," and "contact during motion." Selection by the user of one of these functions may further expand outline 624 to a third level revealing more detailed functions performed by the interactions. For example, selection of "detachable joint" may cause interaction editor 600 to list "bearing joint," "bolted joint," "clamp joint," "slip fit," and "threaded joint."

The user may select a desired interaction function (e.g., "clamp") from interaction function library window 606. An interaction direction selection menu 626 may allow the user to assign a direction to the selected interaction function. Selection of an add button 628 may cause interaction editor 600 to update systems database 202 (FIG. 2) to associate the selected interaction function with the components (i.e., the component selected from component selection menu 602 and the component selected from interacting component selection window 604) of the system. In addition, interaction editor 600 may update interactions window 610 to display the added or edited interaction therein.

Interaction editor 600 may include a next button 630 and a previous button 632. Upon completion of adding interaction functions to the selected components, the user may select next button 630 to select other components in the system for which to capture or to define interactions. Similarly, the user may select previous interaction button 632 to return, for editing purposes, to previous components for which interaction functions have been captured or defined.

Interaction editor 600 may include a save menu 634. Save menu 634 may allow the user to save the captured or defined interaction functions for the system. For example, interaction editor 600 may create or update a file for a particular system, and store the file in systems database 202. The file may include links to or associations with components in component database 204, interactions in interaction database 206, and/or interaction functions in interaction function library 208, as discussed above.

Figure 7:
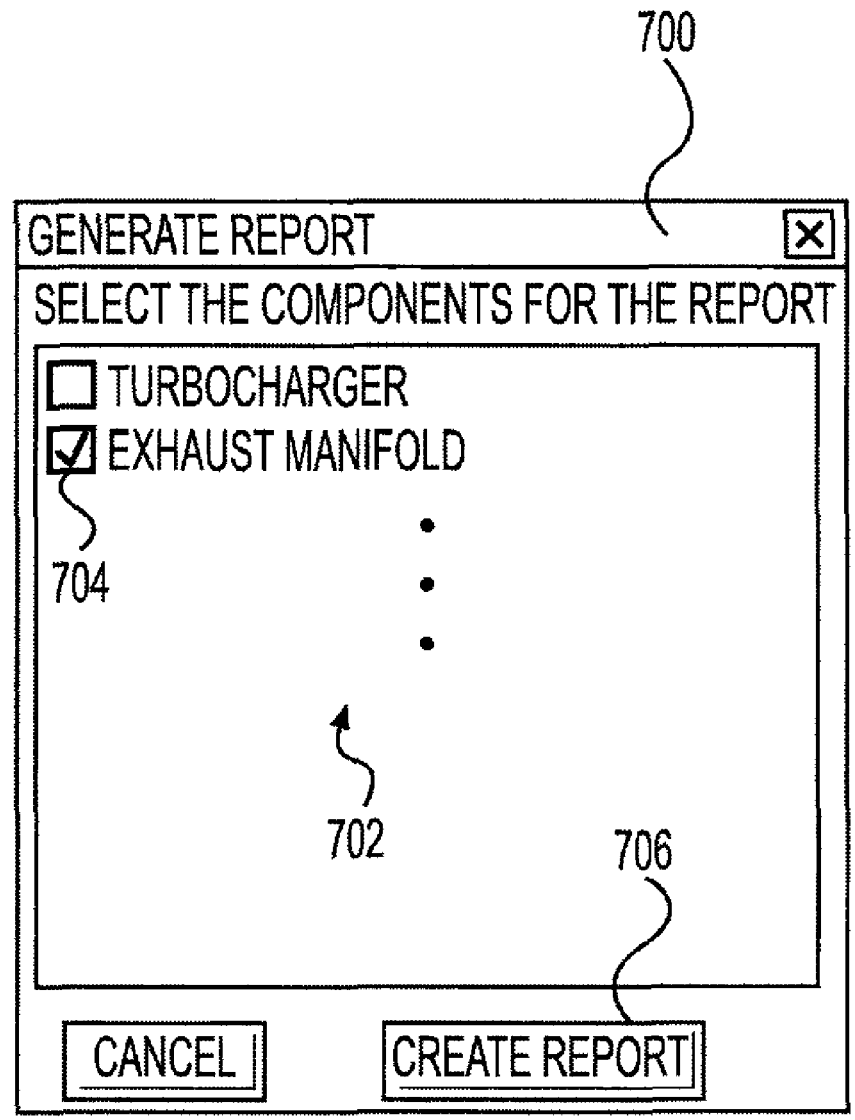
FIG. 7 shows an exemplary disclosed report generation window associated with the interaction editor of FIG. 6.

Interaction editor 600 may include an interaction reports button 636. Interaction reports button 636 may allow the user to generate an interaction report 400 (FIG. 4) for the system, as discussed above. FIG. 7 shows an interaction report generation window 700 that may be displayed upon the user's selection of interaction reports button 636. Interaction report generation window 700 may include a listing 702 of all components in the system. A check box 704 may be associated with each component in the listing 702. The user may select which components to include in interaction report 400 by checking or un-checking check boxes 704. Selection by the user of a create interaction report button 706 may cause interaction editor 600 to generate and to display interaction report 400, as discussed above.

Interaction editor 600 may also include an edit components menu 638. When the user selects edit components menu 638, interaction editor 600 may display an edit components window 800, as shown in FIG. 8. Edit components window 800 may include a column 802 listing all the components in the system; a column 804 listing subsystems in which the components belong; and a column 806 listing descriptions of the components. Columns 802-806 may be sortable. The user may add a new description of a component, or may edit an existing one, by providing input to column 806. Selection of an update button 808 may cause interaction editor 600 to finalize the user's changes to the component descriptions by updating component database 204 (FIG. 2).

Interaction editor 600 may also include an edit interaction function library button 640. When the user selects edit interaction function library button 640, interaction editor 600 may display an edit interaction library window 900, as shown in FIG. 9. Edit interaction library window 900 may include a column 902 listing all available interaction functions in the systems; a column 904 listing types of interactions corresponding to the interaction functions; a column 906 listing phrases explaining how the particular interaction function operates between two components; a column 908 listing descriptions of the interaction functions; and a column 910 listing failure modes of the interaction functions. Columns 902-910 may be sortable. The user may, for example, add a new phrase for an interaction function, or may edit an existing one, by providing input to column 906; add a new description of an interaction function, or edit an existing one, in column 908; and/or add a new failure type for an interaction function, or edit an existing one, in column 910. Selection of an update button 912 may cause interaction editor 600 to finalize the user's changes by updating interaction function library 208 (FIG. 2).

Interaction editor 600 may further include a help window 642. Help window 642 may display information about items selected from component selection menu 602, from interacting component selection window 604, and/or from interaction function library window 606. For example, when the user selects "CGI Valve" from interacting component selection window 604, interaction editor 600 may access component database 204 (FIG. 2) to retrieve a description of the "CGI Valve" component. This description may then be displayed in help window 642. Similarly, as shown in FIG. 6, when the user selects "clamp joint" from interaction function library window 606, interaction editor 600 may access interaction function library 208 (FIG. 2) to retrieve a description for the "clamp joint" interaction function. Specifically, interaction editor 600 may look up "clamp joint" in column 302 in interaction function information 300 (FIG. 3), and may retrieve a corresponding description thereof from column 308. This description may be displayed in help window 642.

One of ordinary skill in the art will appreciate that all or part of systems and methods consistent with the present disclosure may be stored on or read from other computer-readable storage media. Client computing system 106 or server computing system 120 may include a computer-readable storage medium having stored thereon computer-executable instructions which, when executed by a computer, cause the computer to perform, among other things, the methods disclosed herein. Exemplary computer readable storage media may include secondary storage devices, such as hard disks, floppy disks, CD-ROM, or other forms of computer-readable storage media. Such computer-readable storage media may be embodied by one or more components of client computing system 106 or of server computing system 120.

One of ordinary skill in the art will also realize that the processes illustrated in this description may be implemented in a variety of ways and may include multiple other modules, programs, applications, scripts, processes, threads, or code sections that functionally interrelate to accomplish the disclosed processes. For example, it is contemplated that these programs and modules may be implemented using commercially available software tools; using custom object-oriented code written in the C++ programming language; using applets written in the Java programming language; or may be implemented as with discrete electrical components or as one or more hardwired application specific integrated circuits (ASIC) custom designed for this purpose.

INDUSTRIAL APPLICABILITY

The disclosed systems and methods may be applicable to any industry dealing with complex systems having a variety of components that interact with one another in some fashion. For example, the disclosed systems and methods may be useful in product development in the automotive industry, the construction equipment industry, the consumer electronics industry, the defense systems industry, the software development industry, or another industry that produces complex goods or services. Operation of interaction editor 600 will now be explained.

Referring to FIG. 6, a user at client computing system 106 may access interaction editor 600 and may load a file for a particular system of interest, such as a vehicle or a machine. The user may be an engineer on a design team for the vehicle or machine.

Assume, for example, that a design change to the vehicle or machine requires the CGI flow meter to be fastened to the supply lines of the volume/mass airflow sensor (VMAF). Accordingly, the user may select "CGI Flow Meter (Venturi)" from component selection menu 602, and may select "VMAF Lines" from an interacting component selection window 604. The user may recognize that fastening the CGI flow meter to the VMAF lines embodies a physical type of interaction. Thus, the user may click on "physical" in interaction function library window 606. In response, interaction editor 600 may expand outline 624 to list possible functions performed by a physical interaction.

Assume further that the design change calls for a clamp to fasten the CGI flow meter to the VMAF lines. The user may recognize that a clamp is a detachable joint, and therefore may click on "detachable joint" in interaction function library window 606. In response, interaction editor 600 may further expand outline 624 to list possible functions performed by a detachable joint. As shown in FIG. 6, for example, the possible functions may include a "bearing joint," a "bolted joint," a "clamp joint," a "slip fit," and a "threaded joint." Upon reviewing these possible functions, the user may select "clamp joint" from interaction function library window 606.

In addition, the user may recognize that the nature of a clamp joint is such that the CGI flow meter applies a force to the VMAF lines, and vice versa. Accordingly, the user may select bidirectional from interaction direction menu 626. Then, the user may add the interaction by selecting add button 628. In response, interaction editor 600 may update interactions window 610 to display first interaction 609. For example, an unique icon may be displayed to indicate the particular interaction type, and a double-sided arrow may be displayed to indicate that the interaction is bidirectional. Further, a sentence such as "VMAF Lines clamped to CGI Flow Meter" may be generated and displayed. In particular, as discussed above, interaction editor 600 may look up "clamp joint" in interaction function library 208 (FIG. 2), and may retrieve an appropriate phrase (e.g., "clamped to") describing the function performed thereby. Then, based on the two components at issue (the CGI flow meter and the VMAF lines), and the retrieved phrase, interaction editor 600 may generate the sentence "VMAF Lines clamped to CGI Flow Meter."

Assume further that the design change requires the VMAF lines to provide airflow to the CGI flow meter. Accordingly, the user may repeat the steps above to similarly capture second interaction 611; that is, a fluid interaction. After completing all interactions between the CGI flow meter and the VMAF lines, the user may select next button 630 to define interactions between other components of the vehicle or machine, if desired.

In addition, the user may select interaction reports button 636 to generate an interaction report 400 (FIG. 4) for the vehicle or machine. Specifically, the user may select components from listing 702 in interaction report generation window 700 for which the user desires to create an interaction report (FIG. 7). Then, the user may select create interaction report button 706. In response, interaction editor 600 may generate an interaction report 400, as described above (FIG. 4). The user may then view, save, and/or print the interaction report for subsequent analysis.

The user may then generate a FMEA document for the vehicle or machine by selecting "yes" in drop-down menus 414 in rows 416 corresponding to interactions for which the user desires to include in the FMEA document. In response to selecting export to FMEA button 420, interaction editor may generate a FMEA document 500 as discussed above in connection with FIG. 5. The user may then view, save, and/or print FMEA document 500 for subsequent analysis.

In addition, client computing system 106 may provide an automatic link between FMEAs and validation plans for the systems (e.g., vehicles or machines). A validation plan may be a strategy, including activities and procedures, to test the various known failure modes of a system. For example, system information 200 may further include a validation plan database (not shown) storing information about various validation plan activities implemented by the entity (e.g., vehicle or machine designer or manufacturer). Such information may include start and finish dates for testing, test notes, acceptance criteria, product type, product phase, or other information. Systems database 202 may contain information linking various failure modes and/or causes of failures contained in interaction function information 300 to specific tests or validation plan activities contained in the validation plan database. In this manner, each failure mode or cause of failure may be linked to a specific validation activity designed to test that failure mode or cause of failure, and uniform validation plans may be created for the various systems.

Client computing system may 106 may also generate validation plans for the various systems. For example, FMEA document 500 may include a button (not shown) which, when selected by the user, causes client computer system 106 to generate and populate a validation plan document (not shown) for the system. For example, client computing system 106 may look up the various failure modes and/or causes of failure modes listed in columns 506 and/or 508 in the validation plan database. Then, computing system 106 may identify and store in memory the validation plan activities (e.g., tests) associated with or linked to such failure modes and/or failure causes in the validation plan database. Any other validation plan information associated with the failure modes and/or failure causes contained in the validation plan database may also be identified and stored in memory. Computing system 106 may then generate and populate a validation plan document (not shown) for the components listed in FMEA document 500. For example, the validation plan document may list the components contained in column 502, the failure modes contained in column 506, the failure causes contained in column 508, and the identified validation plan activities for the failure modes and/or failure causes. The validation plan document may also contain any other associated information retrieved from the validation plan database. In this manner, a uniform validation plan may be created for any system of interest.

Further, client computing system 106 may provide a validation activity editor GUI (not shown) for creating or editing the validation plan information contained in the validation plan database. For example, client computing system 106 may display a window allowing the user to select a failure mode or a failure cause, and to select one or more validation activities to be associated therewith. That is, the user may, via the validation activity editor, select various validation activities (e.g., tests) to be linked to the failure modes or failure causes for the particular components. Client computing system 106 may update system information 200 and/or the validation plan database accordingly to reflect such links. For example, the selected validation activity (e.g., a piston ring sticking test) may be added or linked to the selected failure mode (e.g., failure to transmit power) for a component (e.g., piston) in the validation plan database. In this manner, anytime a validation plan which includes a particular component is generated, the validation plan may include the updated validation activities selected by the user for the failure modes or failure causes for the componentr. Accordingly, uniformity in validation plans can be achieved across components and systems. The validation activity editor may also allow the user to add other information to a particular validation activity. For example, the user may select a validation activity (e.g., piston temperature test) from the window, and then select or input a desired acceptance criteria for the activity (e.g., 140° F. within a tolerance of 10%). The acceptance criteria may be selected by way of a drop down menu listing a variety of options for the selected criteria or otherwise input by the user. The validation plan database may then be updated with the new acceptance criteria.

The disclosed environment allows interactions in complex systems to be captured. By providing a library of a discrete number of interaction functions from which a user may select, system interactions can be captured consistently and efficiently. For example, situations in which different descriptions are used for what is essentially the same interaction can be avoided. In this manner, interactions can be described uniformly, even across different systems and different users. The interaction function library enables users with different preferences, who would otherwise use different conventions to describe interactions in a system, to use the same convention. Accordingly, confusion can be avoided, and uniform analyses of the system interactions can be made.

It will be apparent to those skilled in the art that various modifications and variations can be made to the disclosed systems and methods. Other embodiments will be apparent to those skilled in the art from consideration of the specification and practice of the disclosure. It is intended that the specification and examples be considered as exemplary only, with a true scope of the present disclosure being indicated by the following claims and their equivalents.

What is claimed is:

1. A computer-implemented method for capturing interactions in a system being executed by a processor, wherein the processor performs steps comprising:
    receiving a selection of a first component of the system;
    receiving a selection of a second component of the system;
    receiving a selection of an interaction between the first component and the second component;
    displaying a list of functions performed by the selected interaction;
    receiving a selection of a function in the list;
    retrieving a phrase describing the selected function;
    generating, based on the retrieved phrase, a sentence for the interaction, the sentence describing how the first selected component interacts with the second selected component in performing the selected function; and
    generating a failure mode and effects analysis (FMEA) document for the system by populating the FMEA document based on the first selected component, on the second selected component, on the selected function, and on the generated sentence.

2. The method of claim 1, wherein the phrase is retrieved from a library of phrases describing functions performed by interactions between components in the system.

3. The method of claim 1, further including generating an interaction report for the system, the interaction report listing the first component, the second component, and the generated sentence.

4. The method of claim 1, wherein the functions in the list are contained in a library of functions describing interactions between components in the system.

5. A computer-readable storage medium containing computer instructions stored therein for causing a computer processor to perform steps comprising:
    receiving a selection of a first component of the system;
    receiving a selection of a second component of the system;
    receiving a selection of an interaction between the first component and the second component;
    displaying a list of functions performed by the selected interaction;
    receiving a selection of a function in the list;
    retrieving a phrase describing the selected function;
    generating, based on the retrieved phrase, a sentence for the interaction, the sentence describing how the first selected component interacts with the second selected component in performing the selected function; and
    generating a failure mode and effects analysis (FMEA) document for the system by populating the FMEA document based on the first selected component, on the second selected component, on the selected function, and on the generated sentence.

6. The computer-readable storage medium of claim 5, wherein the phrase is retrieved from a library of phrases describing functions performed by interactions between components in the system.

7. The computer-readable storage medium of claim 5, the method further including generating an interaction report for the system, the interaction report listing the first component, the second component, and the generated sentence.

8. The computer-readable storage medium of claim 5, wherein the functions in the list are contained in a library of functions describing interactions between components in the system.

9. An apparatus, comprising:
    an input device for receiving user input;
    a display device;
    a component database containing information about components of a system;
    an interaction function library containing information about functions performed by interactions between the components of the system, and storing a library of phrases describing the functions; and
    a processor in communication with the input device, the display device, the component database, and the interaction function library, the processor being configured to:
    receive, via the input device, a selection by the user of a first component of the components of the system;
    receive, via the input device, a selection by the user of a second component of the components of the system;
    receive, via the input device, a selection by the user of an interaction between the first component and the second component;
    identify functions performed by the selected interaction contained in the interaction function library;
    display, via the display device, a list of the identified functions;
    receive, via the input device, a selection by the user of a function in the list;

retrieve a phrase describing the selected function from the interaction function library;

generate, based on the retrieved phrase, a sentence for the selected interaction, the sentence describing how the first selected component interacts with the second selected component in performing the selected function;

generate a failure mode and effects analysis (FMEA) document for the system by populating the FMEA document based on the first selected component, on the second selected component, on the selected function, and on the generated sentence; and display the FMEA document via the display device.

10. The apparatus of claim 9, the processor being further configured to generate an interaction report for the system, the interaction report containing the first component, the second component, and the generated sentence.

11. The apparatus of claim 10, the processor being further configured to display the interaction report.

* * * * *